United States Patent
Chiou et al.

[11] Patent Number: 5,935,321
[45] Date of Patent: Aug. 10, 1999

[54] SINGLE CRYSTAL INGOT AND METHOD FOR GROWING THE SAME

[75] Inventors: Herng-Der Chiou, Tempe; Lawrence Duane Mason, Mesa; James B. Hall, Chandler, all of Ariz.

[73] Assignee: Motorola, Inc., Schaumburg, Ill.

[21] Appl. No.: 08/904,988

[22] Filed: Aug. 1, 1997

[51] Int. Cl.[6] .................................................. C30B 15/20
[52] U.S. Cl. ................................. 117/13; 117/15; 117/911
[58] Field of Search .................................... 117/13, 14, 15, 117/28, 900, 911

[56] References Cited

U.S. PATENT DOCUMENTS

| | | | |
|---|---|---|---|
| 3,798,007 | 3/1974 | Bochman et al. | 23/301 SP |
| 3,958,129 | 5/1976 | Clement et al. | 250/577 |
| 4,973,518 | 11/1990 | Kida et al. | 428/364 |
| 5,126,113 | 6/1992 | Yamagishi et al. | |
| 5,170,061 | 12/1992 | Baba | 250/561 |
| 5,176,787 | 1/1993 | Kawashima et al. | 117/14 |
| 5,240,684 | 8/1993 | Baba et al. | 117/14 |
| 5,288,363 | 2/1994 | Araki | 117/15 |
| 5,487,355 | 1/1996 | Chiou et al. | 117/13 |
| 5,578,284 | 11/1996 | Khar et al. | 423/348 |
| 5,628,823 | 5/1997 | Khar et al. | 117/15 |

FOREIGN PATENT DOCUMENTS 0134680 3/1985 European Pat. Off. ...... C30B 125/26

OTHER PUBLICATIONS

*Journal of Applied Physics*, vol. 30, No. 4, Apr. 1959, "Growth of Silicon Crystals Free from Dislocations" by William C. Dash; pp. 459–474.

*Primary Examiner*—Felisa Hiteshew
*Attorney, Agent, or Firm*—Kevin B. Jackson

[57] ABSTRACT

A single crystal ingot (10) is grown by first inserting a single crystal seed (14) into a melt (11) and pulling the seed (14) at a high pulling rate to grow a single crystal neck (15). The pulling rate is then altered to grow an overhang (18) with a diameter greater than that of the single crystal neck (15). An elongated body (19) is formed below the overhang (18) by adjusting the pulling rate. A multi-arm fixture (30) grabs the overhang (18) to alleviate the tensile and torsional stresses in the single crystal neck (15) that may be caused by the weight and the rotational motion of the single crystal ingot (10).

17 Claims, 6 Drawing Sheets

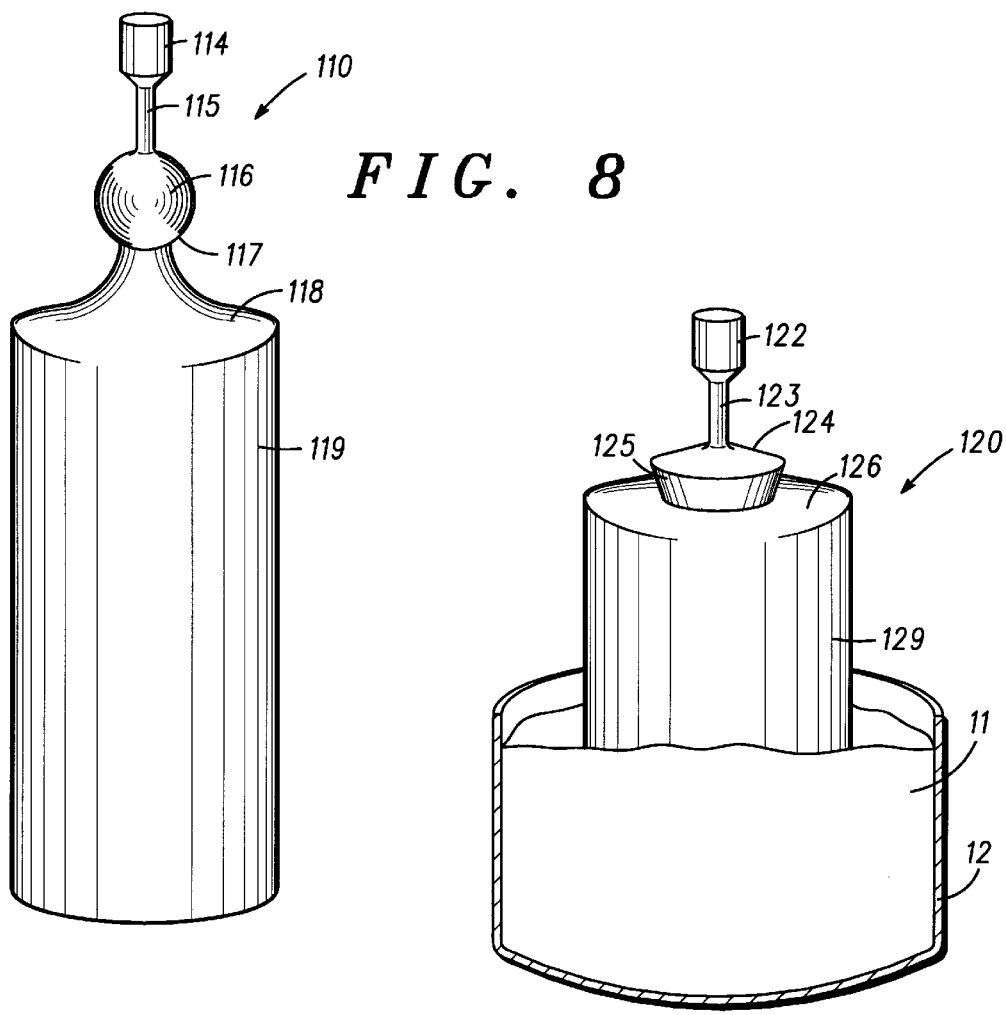
FIG. 8
FIG. 9
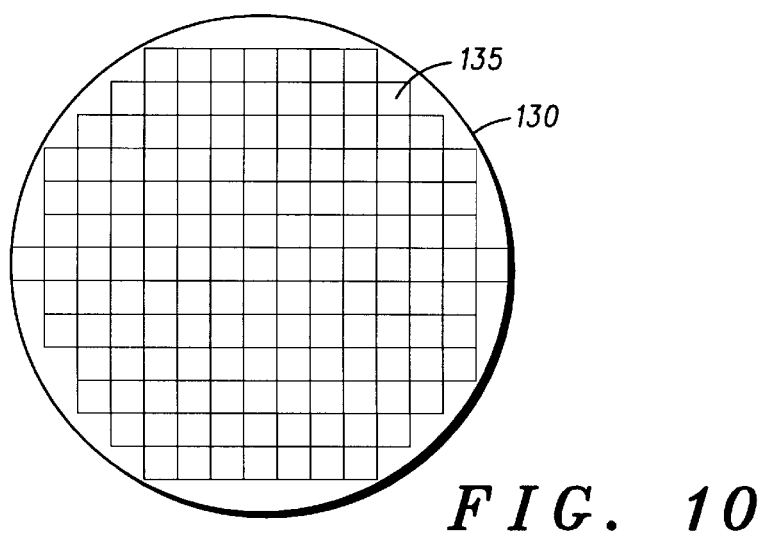
FIG. 10

5,935,321

SINGLE CRYSTAL INGOT AND METHOD FOR GROWING THE SAME

BACKGROUND OF THE INVENTION

The present invention relates, in general, to growing single crystal ingots and, more particularly, to growing large single crystal ingots.

A method for producing single crystal ingots of semiconductor materials is by a technique called the Czochralski method. Using the Czochralski method to grow a single crystal silicon ingot includes forming a melt of polycrystalline silicon in a crucible heated by resistance heating or high frequency heating. A single crystal seed is attached to a seed holder that is connected to an end of a pulling shaft or a cable and dipped into the melt of polycrystalline silicon. Subsequently, the crystal is pulled from the melt while rotating at a specified speed. The diameter of the crystal can be controlled by adjusting the temperature of the melt and/or by adjusting the rate at which the crystal is pulled from the melt. Generally, the temperature of the melt is altered by changing the power provided to the heater.

A well known problem in growing a single crystal ingot is the formation of dislocations in the single crystal ingot. This problem is overcome by beginning the crystal pull relatively quickly to form a thin neck having a diameter ranging from approximately 3 millimeters (mm) to approximately 6 mm. This seeding method is typically referred to as the Dash technique. Once a zero dislocation crystal neck has been achieved, the pulling rate is reduced, resulting in the growth of a larger diameter body from the thin neck. This is a conventional method for growing single crystal ingots having diameters less than 200 mm.

Currently, the semiconductor industry is interested in larger diameter ingots. Further, it is more time efficient and cost efficient to manufacture a given number of semiconductor wafers by growing and slicing a small number of long ingots than by growing and slicing a large number of short ingots. A problem is that when a large ingot is being grown, the thin neck is subjected to more stress than it can structurally handle. Two stresses affect the thin neck, tensile stress from the growing weight of the ingot, and torsional stress from the rotational viscosity drag force of the solid-liquid interface. Both stresses increase with an increase in the diameter of the ingot. The tensile stress also increases with an increase in the length of the ingot. If these combined stresses become greater than the yield strength of the thin neck, the thin neck may break, or more commonly, may generate dislocations in the single crystal.

Accordingly, it would be advantageous to have a single crystal ingot and a method and an apparatus for growing the single crystal ingot. It is desirable for the single crystal ingot to have a large diameter and a long length. It is also desirable for the method and the apparatus to remedy the foregoing and other deficiencies inherent in the prior art when growing a large single crystal ingot.

BRIEF DESCRIPTION OF THE DRAWINGS

FIG. 8 is an elevational view of an ingot in accordance with a fourth embodiment of the invention;

FIG. 9 is an elevational view of an ingot in accordance with a fifth embodiment of the invention; and FIG. 10 illustrates a wafer having a semiconductor device fabricated thereon in accordance with the invention.

It should be noted that the figures are not drawn to scale and that the same reference numerals are used in the figures to represent the elements having similar structures and functions.

DETAILED DESCRIPTION OF THE DRAWINGS

Generally, the present invention provides a single crystal ingot and a method and an apparatus for growing the single crystal ingot. To grow the single crystal ingot of the present invention, a single crystal seed of a material is inserted into a melt of the material. The seed is pulled up from the melt at a high pulling rate and rotated to form a dislocation free thin neck. The pulling rate is then altered to form an overhang and an elongated main body of the ingot. The diameters of the overhang and the elongated body are greater than the diameter of the thin neck. A multi-arm fixture is used to apply a force to the overhang, thereby supporting the weight of the ingot. The upward motion and the rotational motion of the multi-arm fixture are substantially synchronized with those of the ingot. Therefore, both tensile and torsional stresses on the thin neck that may be caused by a large ingot is alleviated.

Figure 1:
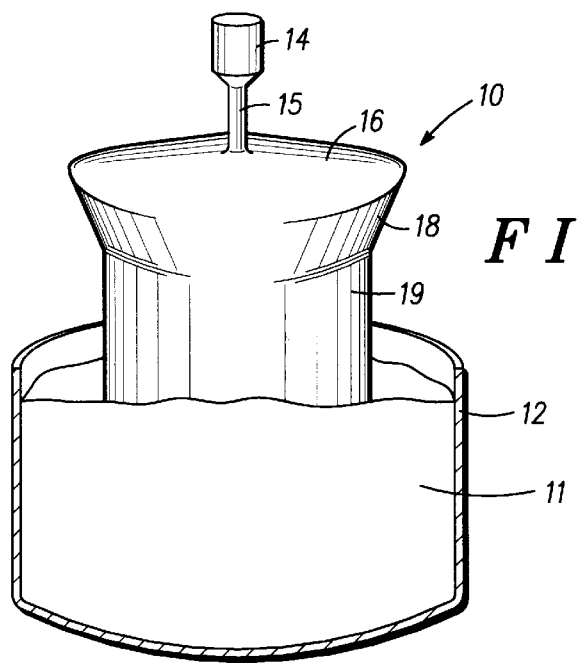
FIG. 1 is an elevational view of an ingot in accordance with a first embodiment of the invention.

FIG. 1 is a partial elevational view of a single crystal ingot 10 being formed from a melt 11 in accordance with a first embodiment of the present invention. By way of example, ingot 10 is an ingot of dislocation free single crystal silicon, which is widely used for manufacturing silicon wafers in the semiconductor industry. Melt 11 is a melt of polycrystalline silicon contained in a crucible 12.

To form ingot 10, a single crystal seed 14 of silicon is lowered into melt 11. The Dash technique is employed to remove dislocations. In employing the Dash technique, seed 14 is pulled from melt 11 at a high pulling rate while rotating at specified speed, resulting in a thin neck 15 extending from seed 14. The diameter of neck 15 is between, for example, approximately 3 millimeters (mm) and approximately 6 mm. When thin neck 15 reaches a length well known in the art, the dislocations will have migrated out of the crystal.

When a dislocation free thin neck 15 of an appropriate length is formed, the pulling rate is decreased to form a shoulder 16 having a diameter greater than that of neck 15. The pulling rate is then gradually increased to form a tapered body 18. The upper portion of tapered body 18 adjacent to shoulder 16 has a diameter greater than that of the lower portion of tapered body 18. By way of example, the diameter of the lower portion of tapered body 18 is between approximately 200 mm and approximately 700 mm, and the length of tapered body 18 is between approximately 20 mm and approximately 50 mm. An elongated body 19 is formed below tapered body 18 by adjusting the pulling rate and/or the temperature of melt 11. The diameter of elongated body 19 is substantially equal to that of the lower portion of tapered body 18.

The fracture strength of single crystal silicon is estimated to be approximately 150 Mega-Pascals (MPa). If the diameter of neck 15 is approximately 3 mm, neck 15 has a breaking point of approximately 108 Kilo-grams (Kg). When the weight of ingot 10 supported by neck 15 exceeds the breaking point, neck 15 will break. Therefore, if the diameter of elongated body 19 is approximately 300 mm, neck 15 will break if the total length of tapered body 18 and elongated body 19 exceeds approximately 650 mm. In order to prevent neck 15 from breaking when growing a large ingot 10, a multi-arm fixture (not shown in FIG. 1) is used to support the weight of ingot 10 and alleviate the stress in neck 15.

Figure 2:
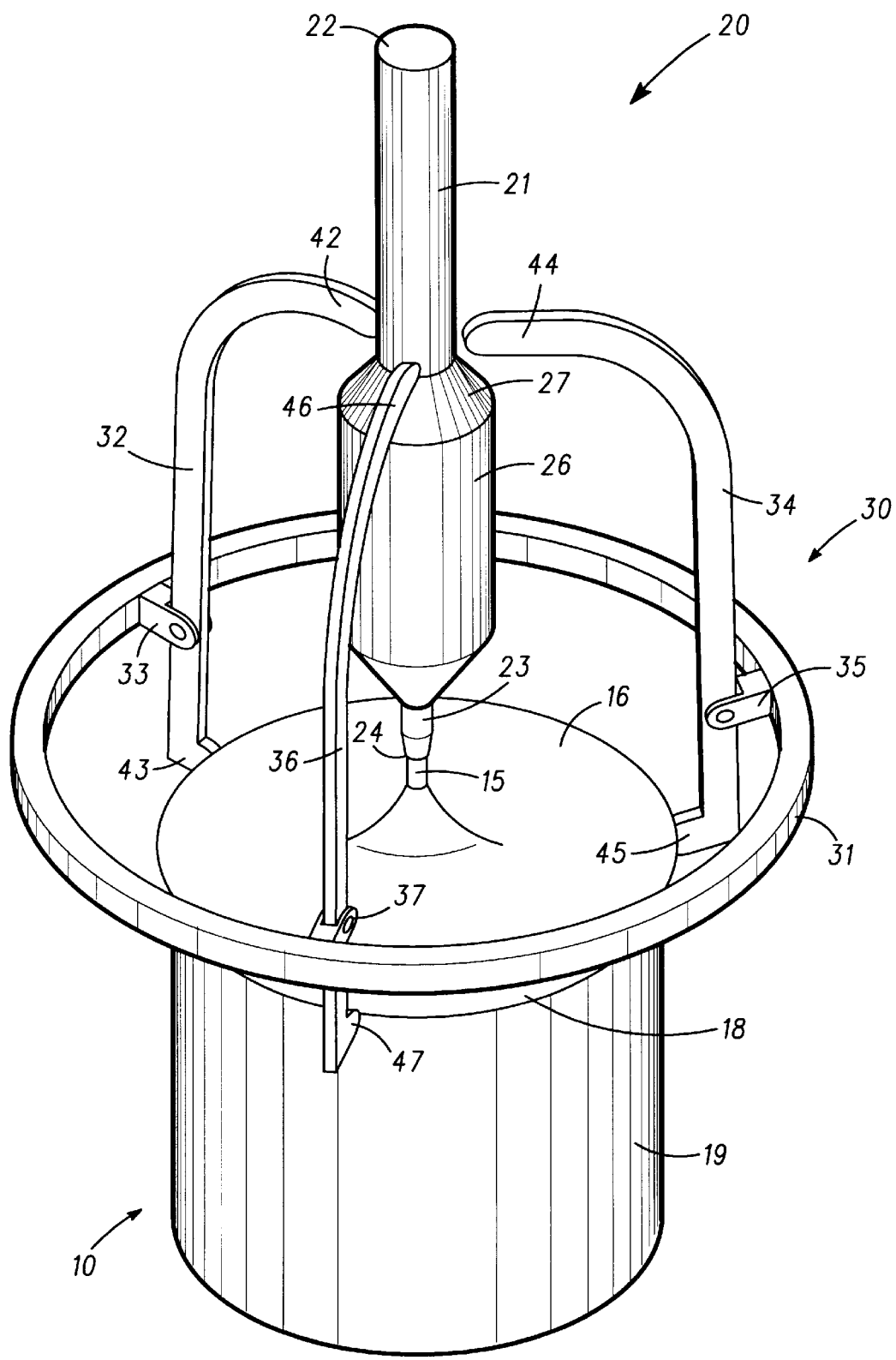
FIG. 2 is a schematic view of an apparatus for growing the ingot of FIG. 1 in accordance with the invention.

FIG. 2 schematically shows an apparatus 20 for growing a single crystal ingot in accordance with the present invention. Apparatus 20 includes a crystal pulling rod 21 and a multi-arm fixture 30. During the process of growing a single crystal ingot, e.g., ingot 10, multi-arm fixture 30 supports single crystal ingot 10 and relieves both tensile and torsional stresses in neck 15. Fixture 30 is also referred to as a multi-finger fixture.

Crystal pulling rod 21 has an upper end 22 and a lower end 23. A crystal seed holder 24 is attached to lower end 23. Rod 21 also has a bulge 26 between upper end 22 and lower end 23. Bulge 26 has an inclined surface 27 adjacent upper end 22. Fixture 30 includes a ring 31 encompassing rod 21. Rod 21 is preferably positioned near the center of ring 31 and substantially perpendicular to ring 31. Fixture 30 also includes arms 32, 34, and 36 pivotally mounted on ring 31 via hinges 33, 35, and 37, respectively. Arms 32, 34, and 36 also are referred to as fingers. Preferably, arms 32, 34, and 36 are substantially evenly spaced from one another on ring 31. Arm 32 has an upper end 42 bent toward the center of ring 31, and a lower end 43. Arm 34 has an upper end 44 bent toward the center of ring 31, and a lower end 45. Arm 36 has an upper end 46 bent toward the center of ring 31, and a lower end 47. Lower ends 43, 45, and 47 are also referred to as the tips of arms 32, 34, and 36, respectively. Preferably, tips 43, 45, and 47 point toward rod 21 positioned near the center of ring 31 In one embodiment, arms 32, 34, and 36 are made of a ceramic material, e.g., fiber reinforced graphite or the like. In another embodiment, arms 32, 34, and 36 are made of a polymide sold under the trademark VESPEL by Du Pont. In yet another embodiment, arms 32, 34, and 36 are made of a metallic material, e.g., molybdenum, stainless steel, or the like. Tips 43, 45, and 47 of arms 32, 34, and 36, respectively, are optionally coated with a layer of polycrystalline silicon to prevent the contamination of ingot 10 by metallic tips 43, 45, and 47. Other materials suitable for coating tips 43, 45, and 47 include graphite, etc.

It should be understood that the structure of apparatus 20 is not limited to that shown in FIG. 2. For example, fixture 30 is not limited to having three arms 32, 34, and 36. In alternative embodiments, fixture 30 can have four arms, five arms, etc. Further, the arms in a fixture, e.g., arms 32, 34, and 36 in fixture 30, are not limited to being evenly spaced from one another.

To grow single crystal ingot 10, single crystal seed 14 (shown in FIG. 1) is placed in seed holder 24 and inserted into melt 11 (shown in FIG. 1) contained in crucible 12 (shown in FIG. 1). Apparatus 20 and crucible 12 are placed in a crystal growing chamber (not shown) filled with an inert gas such as, for example, argon, helium, or the like. Initially, ring 31 rests on a low friction pad (not shown) or a ball bearing (not shown) attached to an interior wall (not shown) of the upper portion of the crystal growing chamber.

Rod 21 is pulled upward at a first pulling rate between, for example, approximately 100 millimeters per hour (mm/h) and approximately 300 mm/h to form thin neck 15. The first pulling rate and the temperature of melt 11 determine the diameter of neck 15. Rod 21 rotates as it is pulled upward. When a dislocation free thin neck 15 of an appropriate length is formed, the pulling rate is altered to a second pulling rate slower than the first pulling rate to form shoulder 16. By way of example, the second pulling rate is between approximately 10 mm/h and approximately 50 mm/h. The pulling rate is then gradually increased to a third rate between, for example, approximately 20 mm/h and approximately 60 mm/h to form tapered body 18. After tapered body 18 reaches a length between, for example, approximately 20 mm and approximately 50 mm, the pulling rate is adjusted to a fourth pulling rate between, for example, approximately 10 mm/h and approximately 60 mm/h to form elongated body 19. Preferably, the pulling rate is gradually altered from the third pulling rate to the fourth pulling rate to integrally form elongated body 19 with tapered body 18.

At one point during the process of forming elongated body 19, rod 21 is at such a position that upper ends 42, 44, and 46 of arms 32, 34, and 36, respectively, come into contact with inclined surface 27 of bulge 26. As rod 21 is pulled upward, upper ends 42, 44, and 46 slide on inclined surface 27. Arms 32, 34, and 36 pivot around hinges 33, 35, and 37, respectively. Tips 43, 45, and 47 of arms 32, 34, and 36, respectively, move toward the center of ring 31 and contact tapered body 18. Fixture 30 starts to rotate with rod 21. As rod 21 is further pulled upward, ring 31 is lifted from the low friction pad (not shown) or the ball bearing (not shown) attached to the interior wall (not shown) of the crystal growing chamber (not shown). Each of tips 43, 45, and 47 applies a force to tapered body 18. A horizontal component of a resultant force of the forces applied by tips 43, 45, and 47 on tapered body 18 is substantially zero. A vertical component of the resultant force is in the upward direction and is substantially equal to or slightly less than the weight of ingot 10. Preferably, fixture 30 grabs tapered body 18 before the weight of ingot 10 exceeds the breaking point of neck 15. In a preferred embodiment, fixture 30 grabs tapered body 18 when the length of elongated body 19 exceeds approximately 200 mm. Therefore, the stress on neck 15 caused by the weight of ingot 10 is reduced. In other words, tapered body 18 is an overhang of ingot 10 and fixture 30 supports ingot 10 by applying an upward resultant force to the overhang. Thus, apparatus 20 can be used to grow a large ingot such as, for example, a single crystal silicon ingot having a diameter equal to or greater than approximately 300 mm and a length greater than 650 mm.

It should be understood that apparatus 20 can also be used to grow ingots having different structures and/or different chemical compositions from single crystal silicon ingot 10. For example, apparatus 20 can be used to grow ingots of germanium, gallium arsenide, indium phosphide, etc. Any ingot having a tapered body like tapered body 18 in ingot 10 can be grown using apparatus 20. Further, apparatus 20 can be used to lift an object in applications other than crystal growing.

Figure 3:
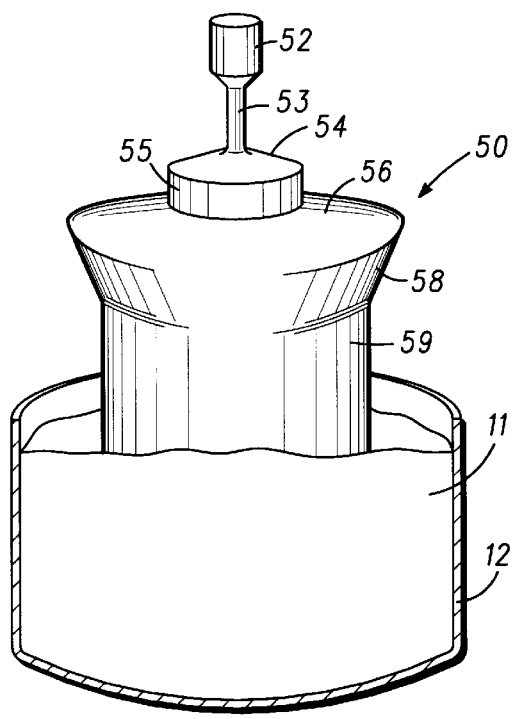
FIG. 3 is an elevational view of an ingot in accordance with a second embodiment of the invention.

FIG. 3 schematically shows a single crystal semiconductor ingot 50 that can be grown using apparatus 20 of FIG. 2 in accordance with a second embodiment of the present invention. To form ingot 50, a single crystal seed 52 is lowered into melt 11 contained in crucible 12. In employing the Dash technique, seed 52 is pulled from melt 11 to form a first neck 53 extending from seed 52 and having a diameter between, for example, approximately 3 mm and approximately 6 mm. When first neck 53 reaches a length well known in the art, the dislocations will have migrated out of the crystal. When a dislocation free first neck 53 of an appropriate length is formed, the pulling rate is slowed to a second pulling rate to form a first shoulder 54. The pulling rate is then gradually increased to a third pulling rate to form a second neck 55. Second neck 55 has a diameter greater than that of first neck 53. Second neck 55 serves to facilitate the heat dissipation from ingot 50, thereby increasing the yield strength of single crystal silicon and avoiding the dislocation generation in ingot 50. Ingot 50 also has a second shoulder 56, a tapered body 58, and an elongated body 59, which are formed in process steps analogous to those forming shoulder 16, tapered body 18, and elongated body 19, respectively, in ingot 10 (shown in FIG. 1). Tapered body 58 serves as an overhang of ingot 50. At one point during the process of forming ingot 50, arms 32, 34, and 36 of fixture 30 (shown in FIG. 2) grab tapered body 58. Fixture 30 rises and rotates in a motion substantially synchronized with the motion of rod 21 (shown in FIG. 2). Fixture 30 supports, at least partially, the weight of ingot 50 and alleviates both tensile and torsional stresses in first neck 53.

Figure 4:
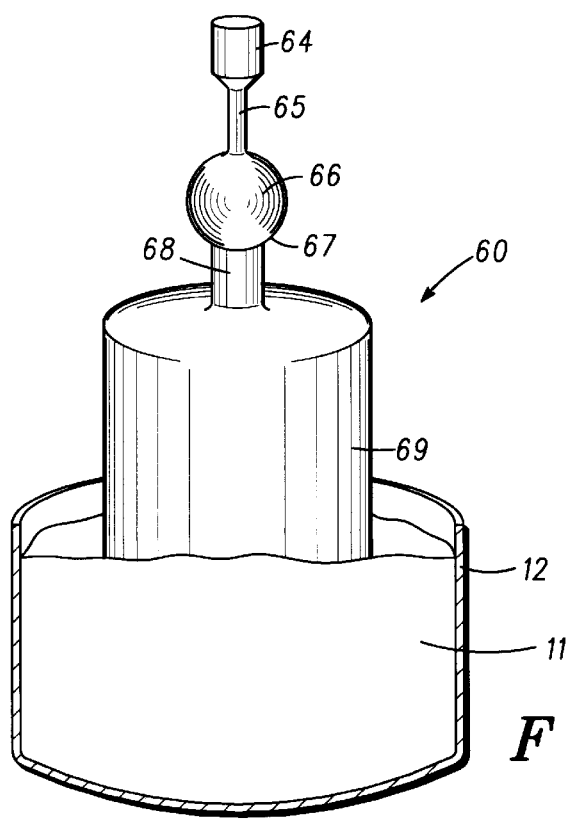
FIG. 4 is an elevational view of an ingot in accordance with a third embodiment of the invention.

FIG. 4 is an elevational view of a single crystal ingot 60 in accordance with a third embodiment of the present invention. Like ingot 10 (shown in FIG. 1), ingot 60 is formed from melt 11 contained in crucible 12. To form ingot 60, a single crystal seed 64 is lowered into melt 11. The Dash technique is employed to remove dislocations. In employing the Dash technique, seed 64 is pulled from melt 11 at a first pulling rate, resulting in a first neck 65 extending from seed 64. Neck 65 has a diameter between, for example, approximately 3 mm and approximately 6 mm. When a dislocation free neck 65 of an appropriate length is formed, the pulling rate is decreased and then increased to form a bulb 66 having a diameter greater than that of neck 65. Bulb 66 has a surface 67 facing downward and serves as an overhang of ingot 60. A second neck 68 is formed below bulb 66. The diameter of second neck 68 is less than that of bulb 66 and greater than that of first neck 65. By way of example, the diameter of bulb 66 is between approximately 20 mm and approximately 100 mm, and the diameter of second neck 68 is between approximately 10 mm and approximately 50 mm. An elongated body 69 is formed below neck 68 by adjusting the pulling rate and/or the temperature of melt 11. The diameter of elongated body 69 is between, for example, approximately 200 mm and approximately 700 mm. Like neck 15 of ingot 10 (shown in FIG. 1), neck 65 has a breaking point and will break if the weight of ingot 60 supported by neck 65 exceeds the breaking point. In order to prevent neck 65 from breaking when growing a large ingot 60, a multi-arm fixture (not shown in FIG. 4) is used to apply an upward force to surface 67 of bulb 66, thereby supporting, at least partially, the weight of ingot 60 and alleviating both tensile and torsional stresses in neck 65.

Figure 5:
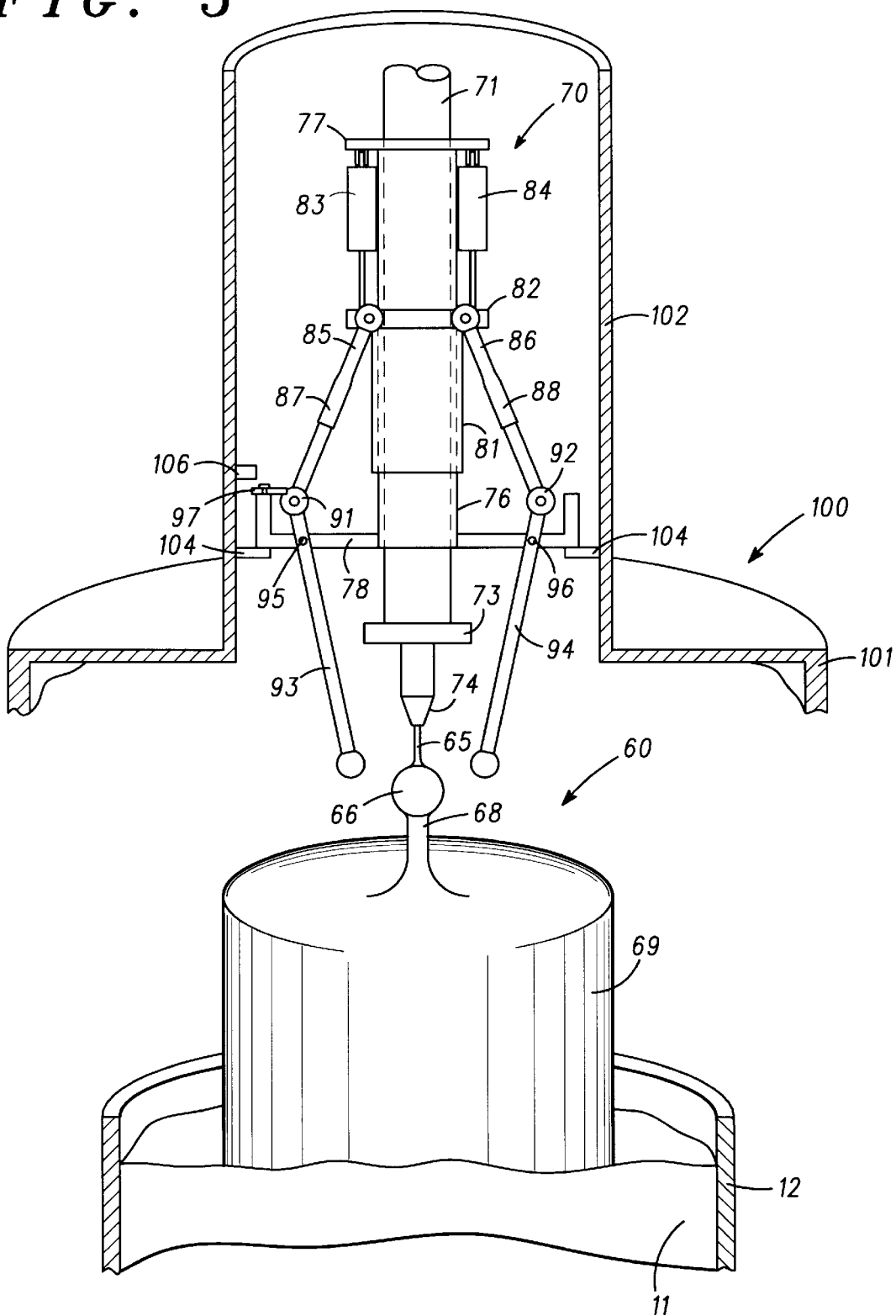
FIGS. 5 and 6 are schematic views of an apparatus for growing the ingot of FIG. 4 in accordance with the invention.
Figure 6:
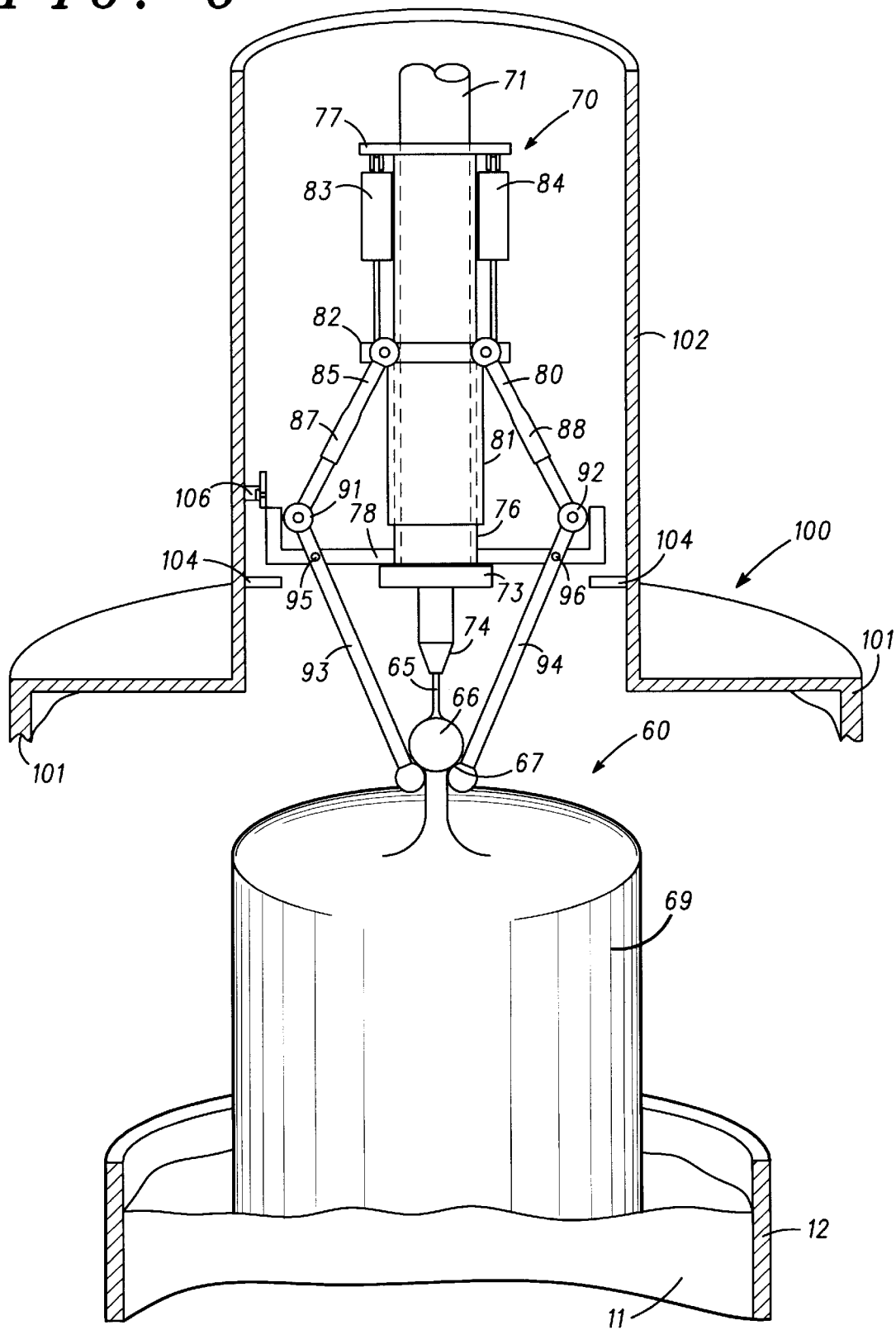

FIGS. 5 and 6 schematically show an apparatus 70 for growing a single crystal ingot, e.g., ingot 60, in accordance with the present invention. During the process of growing ingot 60, apparatus 70 supports the weight of ingot 60 and relieves the stress in neck 65.

Referring now to FIG. 5, apparatus 70 has a crystal pulling shaft 71. A lift block 73 is attached to shaft 71 adjacent to the lower end of shaft 71. A crystal seed holder 74 is attached to shaft 71 below lift block 73. An inner cylinder 76 encompasses shaft 71. A mounting structure 77 and a support structure 78 are attached to the upper end and the lower end, respectively, of inner cylinder 76. An outer cylinder 81 encompasses inner cylinder 76 and has a platform 82 attached thereto. Inner cylinder 76 and outer cylinder 81 are coupled to each other via springs 83 and 84.

More particularly, springs 83 and 84 have their upper ends attached to mounting structure 77 and their lower ends attached to platform 82. In a preferred embodiment, springs 83 and 84 are pressurized gas springs.

Apparatus 70 also has four upper arms and four lower arms coupled between platform 82 and support structure 78. The upper arms are also referred to as linkage arms, the lower arms are also referred to as grabber arms or grabbing arms, and apparatus 70 is also referred to as a multi-arm fixture. Preferably, the four upper arms are substantially evenly spaced from one another along the periphery of platform 82. Each upper arm is preferably pivotally connected to a corresponding lower arm. Therefore, the four lower arms are also substantially spaced from one another. Because of the limitation of two dimensional cross-sectional view, only two upper arms, i.e., linkage arms 85 and 86, and two lower arms, i.e., grabbing arms 93 and 94, are shown in FIG. 5. Linkage arm 85 has a shock absorbing spring 87 between its upper end and lower end. The upper end of linkage arm 85 is pivotally connected to platform 82. A hinge 91 pivotally attaches the lower end of linkage arm 85 to an upper end of grabbing arm 93. A lower end of grabbing arm 93 serves to grab bulb 66 of ingot 60 during the crystal ingot growing process. A pivotal point between the two ends of grabbing arm 93 is mounted to support structure 78 via a hinge 95. Likewise, linkage arm 86 has a shock absorbing spring 88 between its upper end and lower end. The upper end of linkage arm 86 is pivotally connected to platform 82. A hinge 92 pivotally attaches the lower end of linkage arm 86 to an upper end of grabbing arm 94. A lower end of grabbing arm 94 grabs bulb 66 of ingot 60 during the crystal ingot growing process. A hinge 96 between the two ends of grabbing arm 94 pivotally mounts grabbing arm 94 to support structure 78. A latch 97 is mounted on support structure 78 adjacent hinge 91. When engaged to hinge 91, latch 97 defines a position of linkage arm 85 and prevents a pivotal motion of linkage arm 85 and grabbing arm 93. In addition, springs 83 and 84 are in stress when latch 97 is engaged to hinge 91.

Like arms 32, 34, and 36 in apparatus 20 (shown in FIG. 2), the grabbing arms in apparatus 70 are preferably made of a ceramic material, a metallic material, or a polymide. To prevent the contamination of an ingot grown using apparatus 70, a layer of graphite or polycrystalline silicon is optionally coated on the lower ends of the grabbing arms in apparatus 70.

It should be understood that the structure of apparatus 70 is not limited to being that described hereinbefore. For example, apparatus 70 is not limited to having four linkage arms and four grabbing arms. Preferably, apparatus 70 has at least three grabbing arms coupled to at least three linkage arms. In other words, the number of grabbing arms in apparatus 70 can be three, five, six, or the like, and the number of linkage arms in apparatus 70 can be three, five, six, etc. Further, the linkage arms in apparatus 70 are not limited to being evenly spaced from one another. In addition, the shock absorbing springs in the linkage arms, e.g., shock absorbing springs 87 and 88, are optional in apparatus 70. The number of springs, e.g., springs 83 and 84, coupled between mounting structure 77 of inner cylinder 76 and platform 82 of outer cylinder 81 is not limited to being two as described hereinbefore. Apparatus 70 can have any number of springs, e.g., one, three, four, etc., coupled between inner cylinder 76 and outer cylinder 81. Further, apparatus 70 is not limited to having one latch, i.e., latch 97, as shown in FIG. 5. In an alternative embodiment, a second latch (not shown) is mounted on support structure 78 adjacent hinge 92 and serves to limit the pivotal motions of linkage arm 86 and grabbing arm 94. In another alternative embodiment, apparatus 70 has four latches mounted on support structure 78, and each latch serves to engage the hinge between a corresponding pair of linkage and grabbing arms.

To grow ingot 60 using apparatus 70, single crystal seed 64 (shown in FIG. 4) is placed in seed holder 74. Apparatus 70 and crucible 12 are placed in a crystal growing chamber 100 filled with an inert gas such as, for example, argon, helium, or the like. Chamber 100 has a lower subchamber 101 and an upper subchamber 102. Crucible 12 is in lower subchamber 101. Upper subchamber 102 surrounds shaft 71, inner cylinder 76, outer cylinder 81, and support structure 78. Thus, upper subchamber 102 functions as a periphery structure of apparatus 70. A rest block 104 is formed on an interior wall of upper subchamber 102. Preferably, rest block 104 has a ring structure and FIG. 5 shows a cross section of the ring structure. A latch trip block 106 is located on the interior wall of upper subchamber 102 and above rest block 104. Initially, support structure 78 rests on rest block 104, springs 83 and 84 coupled between inner cylinder 76 and outer cylinder 81 are compressed, and latch 97 is engaged with hinge 91 to prevent the downward motion of outer cylinder 81 relative to inner cylinder 76.

Shaft 71 is lowered to insert seed 64 (shown in FIG. 4) into melt 11. Shaft 71 is then pulled upward at a first pulling rate between, for example, approximately 100 mm/h and approximately 300 mm/h, to form first neck 65. Shaft 71 rotates as it is pulled upward. When a dislocation free thin neck 65 of an appropriate length is formed, the pulling rate is decreased and then increased to form bulb 66 having a diameter greater than that of neck 65. Bulb 66 has a surface 67 facing downward. Second neck 68 is then formed below bulb 66. The diameter of second neck 68 is less than that of bulb 66 and greater than that of first neck 65. Elongated body 69 is formed below neck 68 by adjusting the pulling rate and/or the temperature of melt 11.

At a time after bulb 66 is formed, shaft 71 is pulled to such a position that lift block 73 comes into contact with support structure 78 of inner cylinder 76. As shaft 71 is pulled upward, lift block 73 lifts inner cylinder 76 upward from rest block 104. Because outer cylinder 81 is prevented from moving downward relative to inner cylinder 76 by latch 97 engaged with hinge 91, outer cylinder 81 also moves upward. The motions of shaft 71, inner cylinder 76, and outer cylinder 81 are substantially synchronized with one another.

Referring now to FIG. 6, as shaft 71 is further pulled upward, latch 97 passes latch trip block 106, which trips latch 97 and disengages latch 97 from hinge 91. Hinge 91 is now free to move outward away from shaft 71. Springs 83 and 84 relax and expand, forcing outer cylinder 81 to slide downward relative to inner cylinder 76. The sliding motion of outer cylinder 81 causes grabbing arm 93 to pivot around hinge 95. The lower end of grabbing arm 93 moves toward ingot 60 and comes into contact with surface 67 of bulb 66. Likewise, linkage arm 86 causes a pivotal motion of grabbing arm 94 around hinge 96. The lower end of grabbing arm 94 moves toward ingot 60 and comes into contact with surface 67 of bulb 66. It should be noted that the lower ends of the two grabbing arms not shown in FIGS. 5 and 6 also come into contact with surface 67 of bulb 66. In other words, the four grabbing arms grab bulb 66. Each of the four grabbing arms applies a force to bulb 66. A horizontal component of a resultant force of the forces applied by the four grabbing arms on bulb 66 is substantially zero. A vertical component of the resultant force is in the upward direction and is substantially equal to or slightly less than the weight of ingot 60. By way of example, the vertical component of the resultant force is approximately 15 Kg less than the weight of ingot 60 when apparatus 70 grabs bulb 66. Preferably, apparatus 70 grabs bulb 66 before the weight of ingot 60 exceeds the breaking point of neck 65. In other words, bulb 66 serves as an overhang of ingot 60 and apparatus 70 supports ingot 60 by applying an upward resultant force to the overhang. Therefore, the stress on neck 65 caused by the weight of ingot 60 is reduced. Apparatus 70 is suitable for use in growing a large ingot such as, for example, a single crystal silicon ingot having a diameter equal to or greater than approximately 300 mm and a length greater than 650 mm.

Figure 7:
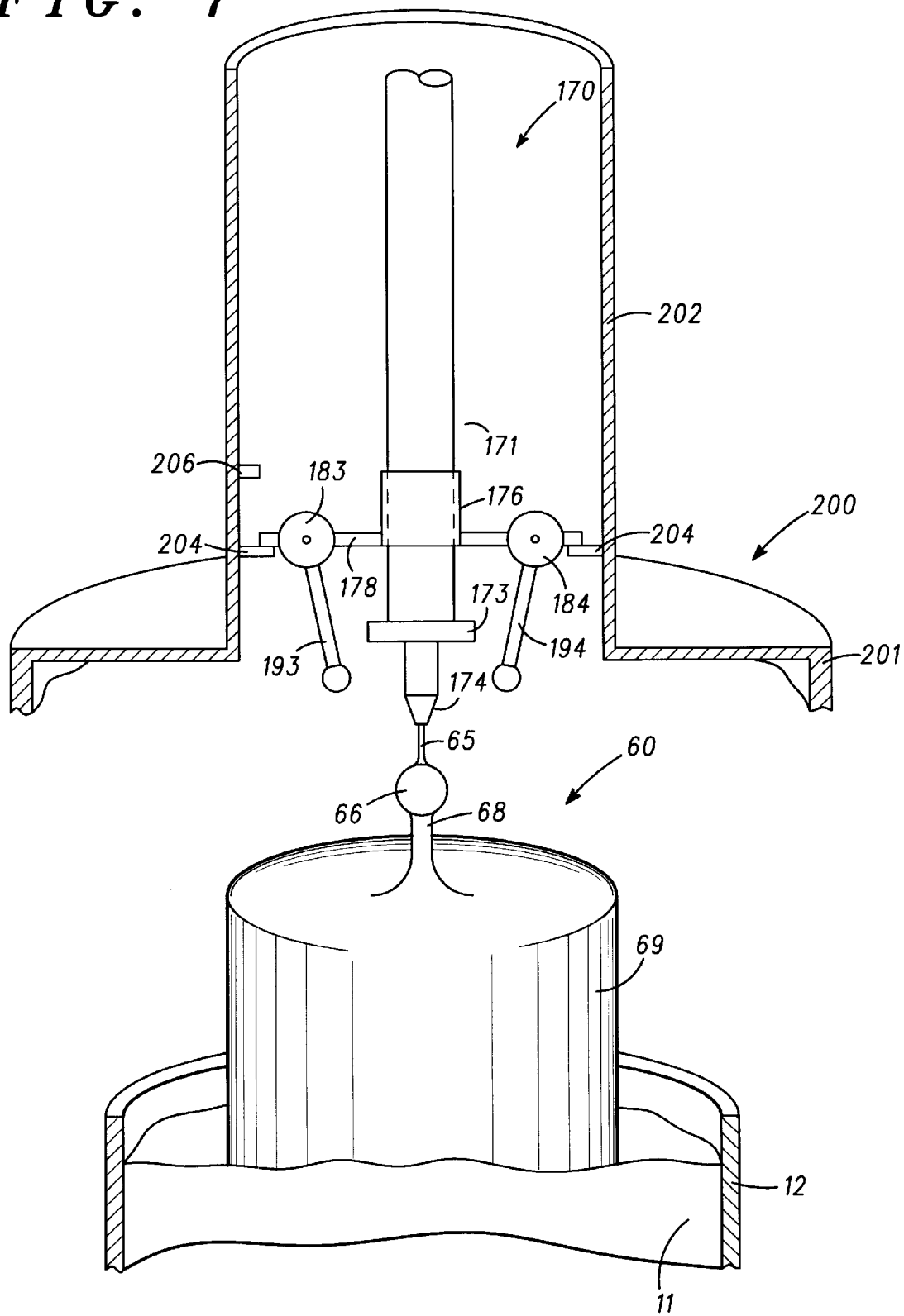
FIG. 7 is a schematic view of another apparatus for growing the ingot of FIG. 4 in accordance with the invention.

FIG. 7 schematically shows an apparatus 170 for growing a single crystal ingot, e.g., ingot 60, in accordance with the present invention. Apparatus 170 is also referred to as a multi-arm fixture. During the process of growing ingot 60, apparatus 170 supports the weight of ingot 60 and relieves the stress in neck 65.

Apparatus 170 has a crystal pulling shaft 171. A lift block 173 is attached to shaft 171 adjacent to the lower end of shaft 171. A crystal seed holder 174 is attached to shaft 171 below lift block 173. A cylinder 176 encompasses shaft 171. A support structure 178 is attached to the lower end of cylinder 176. Apparatus 170 also has four servo actuators and four grabbing arms. The servo actuators are mounted on support structure 178. Each grabbing arm has an upper end pivotally attached to a corresponding servo actuator. The lower ends of the grabbing arms are positioned below support structure 178. When activated, each servo actuator actuates a corresponding grabbing arm and causes the lower end of the corresponding grabbing arm to move toward the lower end of shaft 171. Preferably, the four servo actuators are substantially evenly spaced from one another on support structure 178. Because of the limitation of the two dimensional cross-sectional view, only two servo actuators, i.e., servo actuators 183 and 184, and two grabbing arms, i.e., grabbing arms 193 and 194, are shown in FIG. 7. By way of example, the servo actuators, e.g., servo actuators 183 and 184, are hydraulic modules.

Like the grabbing arms in apparatus 70 (shown in FIGS. 5 and 6), the grabbing arms in apparatus 170 are preferably made of a ceramic material, a metallic material, or a polymide. To prevent the contamination of an ingot grown using apparatus 170, a layer of graphite or polycrystalline silicon is optionally coated on the lower ends of the grabbing arms in apparatus 170.

Apparatus 170 is placed in a crystal growing chamber 200. Chamber 200 has a lower subchamber 201 and an upper subchamber 202. Upper subchamber 202 surrounds shaft 171, cylinder 176, and support structure 178. Thus, upper subchamber 202 functions as a periphery structure of apparatus 170. A rest block 204 is formed on an interior wall of upper subchamber 202. Preferably, rest block 204 has a ring structure and FIG. 7 shows a cross section of the ring structure. A sensor such as, for example, an optical sensor 206 is attached to the interior wall of upper subchamber 202 and located above rest block 204. Support structure 178 initially rests on rest block 204. During the process of growing a single crystal ingot, sensor 206 senses a position of cylinder 176 relative to chamber 200 and activates the servo actuators in response to the position of cylinder 176 being above a predetermined level. In a preferred embodiment, sensor 206 activates the servo actuators when support structure 178 adjacent to the lower end of cylinder 176 moves upward and passes sensor 206. Hydraulic lines (not shown) are used to couple the servo actuators, e.g., servo actuators 183 and 184, to a hydraulic pump (not shown) outside chamber 200. A rotary union (not shown) well known in the art is preferably used to connect the hydraulic line in chamber 200 to the hydraulic line outside chamber 200.

It should be understood that the structure of apparatus 170 is not limited to being that described hereinbefore. For example, apparatus 170 is not limited to having four grabbing arms connected to four servo actuators. Preferably, apparatus 170 has at least three grabbing arms. In other words, the number of grabbing arms in apparatus 170 can be three, five, six, etc. Further, the grabbing arms in apparatus 170 are not limited to being evenly spaced from one another. Support structure 178 is not limited to being adjacent to the lower end of cylinder 176. The servo actuators, e.g., servo actuators 183 and 184, are not limited to being hydraulic modules. Other types of servomechanical modules can serve as servo actuators in apparatus 170. For example, the servo actuators in apparatus 170 can be pneumatic modules, electrical servomotor modules, or the like. Sensor 206 is not limited to being an optical sensor. Any sensor that is able to sense the position of support structure 178 or cylinder 176 can replace optical sensor 206 in apparatus 170. Further, sensor 206 is not limited to being located above rest block 204. In an alternative embodiment, sensor 206 is located below rest block 204 and senses the position of seed holder 174. In another alternative embodiment, sensor 206 is located below rest block 204 and senses the position of bulb 66 of ingot 60.

To grow ingot 60 using apparatus 170, single crystal seed 64 (shown in FIG. 4) is placed in seed holder 174. Shaft 171 is lowered to insert seed 64 into melt 11 contained in crucible 12, which is placed in lower subchamber 201. Support structure 178 rests on rest block 204. Shaft 171 is then pulled upward at a first pulling rate and rotated to form first neck 65. When a dislocation free thin neck 65 of an appropriate length is formed, the pulling rate is decreased and then increased to form bulb 66 having a diameter greater than that of neck 65. Bulb 66 has a surface 67 facing downward. Second neck 68 is then formed below bulb 66. The diameter of second neck 68 is less than that of bulb 66 and greater than that of first neck 65. Elongated body 69 is formed below neck 68 by adjusting the pulling rate and/or the temperature of melt 11.

After bulb 66 is formed, shaft 171 is pulled to such a position that lift block 173 comes into contact with and lifts cylinder 176 upward from rest block 204. As shaft 171 is further pulled upward, support structure 178 passes sensor 206. Sensor 206 senses the position of support structure 178 and activates the servo actuators, e.g. servo actuators 183 and 184. Servo actuators 183 and 184 actuate grabbing arms 193 and 194, respectively. The lower ends of grabbing arms 193 and 194 move toward ingot 60 and come into contact with surface 67 of bulb 66. It should be noted that the lower ends of the two grabbing arms not shown in FIG. 7 also come into contact with surface 67 of bulb 66. In other words, the four grabbing arms grab bulb 66. Each of the four grabbing arms applies a force to bulb 66. A horizontal component of a resultant force of the forces applied by the four grabbing arms on bulb 66 is substantially zero. A vertical component of the resultant force is in the upward direction and is substantially equal to or slightly less than the weight of ingot 60. By way of example, the vertical component of the resultant force is approximately 20 Kg less than the weight of ingot 60 when apparatus 170 grabs bulb 66. Preferably, apparatus 170 grabs bulb 66 before the weight of ingot 60 exceeds the breaking point of neck 65. Therefore, the stress on neck 65 is reduced. Apparatus 170 is suitable for use in growing a large ingot such as, for example, a single crystal silicon ingot having a diameter equal to or greater than approximately 300 mm and a length greater than 650 mm.

It should be understood that apparatus 70 (shown in FIGS. 5 and 6) and apparatus 170 (shown in FIG. 7) can be used to grow ingots having different structures and/or different chemical compositions than single crystal silicon ingot 60. For example, apparatuses 70 and 170 can be used to grow single crystal ingots of germanium, gallium arsenide, indium phosphide, etc. Any ingot having an overhang like bulb 66 in ingot 60 can be grown using either apparatus 70 or apparatus 170. Further, apparatuses 70 and 170 can be used to lift an object in applications other than crystal growing.

FIG. 8 schematically shows an ingot 110 in accordance with a fourth embodiment of the present invention. Ingot 110 can be grown using either apparatus 70 (shown in FIGS. 5 and 6) or apparatus 170 (shown in FIG. 7) To form ingot 110, a single crystal seed 114 of a semiconductor material is lowered into a melt (not shown) of the same material as seed 114. In employing the Dash technique, seed 114 is pulled from the melt to form a thin neck 115 extending from seed 114. Neck 115 has a diameter between, for example, approximately 3 mm and approximately 6 mm. When neck 115 reaches a length well known in the art, the dislocations will have migrated out of the crystal. When a dislocation free neck 115 of an appropriate length is formed, the pulling rate is decreased and then increased to form a bulb 116 having a diameter greater than that of neck 115. Bulb 116 has a surface 117 facing downward. A shoulder 118 is then formed below bulb 116. The diameter of shoulder 118 adjacent bulb 116 is less than that of bulb 116 and greater than that of neck 115. By way of example, the diameter of bulb 116 is between approximately 20 mm and approximately 100 mm, and the diameter of shoulder 118 adjacent bulb 116 is between approximately 10 mm and approximately 50 mm. An elongated body 119 is formed below shoulder 118 by adjusting the pulling rate and/or the temperature of the melt. The diameter of elongated body 119 is between, for example, approximately 200 mm and approximately 700 mm. If ingot 110 is grown using apparatus 70 (shown in FIGS. 5 and 6), the grabbing arms of apparatus 70 grab bulb 116 before the weight of ingot 110 reaches the breaking point of neck 115. The grabbing arms rise and rotate in a motion substantially synchronized with the motion of shaft 71 (shown in FIGS. 5 and 6). Apparatus 70 partially supports the weight of ingot 110 and alleviates the stress in neck 115. If ingot 110 is grown using apparatus 170 (shown in FIG. 7), the grabbing arms of apparatus 170 grab bulb 116 before the weight of ingot 110 reaches the breaking point of neck 115. The grabbing arms rise and rotate in a motion substantially synchronized with the motion of shaft 171 (shown in FIG. 7). Apparatus 170 supports, at least partially, the weight of ingot 110 and alleviates the stress in neck 115.

FIG. 9 schematically shows a single crystal semiconductor ingot 120 in accordance with a fifth embodiment of the present invention. Ingot 120 can be grown using an apparatus (not shown) that has a crystal pulling rod and a multi-arm fixture comprised of a ring and a plurality of grabbing arms. The apparatus used to grow ingot 120 is structurally similar to apparatus 20 (shown in FIG. 2). To form ingot 120, a single crystal seed 122 is lowered into melt 11 contained in crucible 12. In employing the Dash technique, seed 122 is pulled from melt 11 to form a neck 123 extending from seed 122 and having a diameter between, for example, approximately 3 mm and approximately 6 mm. When neck 123 reaches a length well known in the art, the dislocations will have migrated out of the crystal. When a dislocation free neck 123 of an appropriate length is formed, the pulling rate is slowed to a second pulling rate to form a first shoulder 124 having a diameter greater than that of neck 123. The pulling rate is then gradually increased to a third pulling rate to form a tapered body 125. The lower portion of tapered body 125 has a diameter greater than that of neck 123 and less than a diameter of the upper portion of tapered body 125. By way of example, the diameter of the lower portion of tapered body 125 is between approximately 20 mm and approximately 150 mm. Like tapered body 18 of ingot 10 (shown in FIG. 1), tapered body 125 serves as an overhang of ingot 120. In addition, tapered body 125 serves to facilitate heat dissipation from ingot 120 in a way analogous to second neck 55 of ingot 50 (shown in FIG. 3). Therefore, tapered body 125 is also referred to as a second neck or a tapered neck. A second shoulder 126 is formed below tapered neck 125, and an elongated body 129 is formed below second shoulder 126. At one point during the process of forming ingot 120, the grabbing arms (not shown) similar to arms 32, 34, and 36 in fixture 30 (shown in FIG. 2) grab tapered neck 125. Because the diameter of tapered neck 125 is smaller than that of tapered body 18 of ingot 10 (shown in FIG. 1), a difference between the fixture used to grab tapered neck 125 and fixture 30 is that the grabbing arms for grabbing tapered neck 125 can move closer toward the center of the ring than arms 32, 34, and 36 can move toward the center of ring 31 (shown in FIG. 2). This can be achieved in several ways such as, for example, bending the lower ends of the grabbing arms toward the center of the ring and/or forming a larger bulge on the crystal pulling rod than bulge 26 on rod 21. Another difference is that the grabbing arms for grabbing tapered neck 125 are shorter than arms 32, 34, and 36 in fixture 30. After grabbing tapered neck 125, the fixture rises and rotates in a motion substantially synchronized with the motion of ingot 120. The fixture partially supports the weight of ingot 120 and alleviates both tensile and torsional stresses in neck 123.

After a semiconductor ingot is formed, the elongated body of the ingot can be sliced to provide semiconductor wafers. Techniques of slicing an ingot into a plurality of wafers are well known in the art. Semiconductor devices are then fabricated on the wafers. FIG. 10 is a schematic view of a semiconductor wafer 130 having a semiconductor device 135 fabricated thereon in accordance with the present invention. Wafer 130 is manufactured by slicing an ingot such as, for example, ingot 10 (shown in FIG. 1), ingot 50 (shown in FIG. 3), ingot 60 (shown in FIG. 4), ingot 110 (shown in FIG. 8), or ingot 120 (shown in FIG. 9). Semiconductor device 135 is fabricated on wafer 130 using processing steps such as, for example, oxide growth, ion implantation, photoresist masking, etching, chemical deposition, etc. Generally, wafer 130 has many devices fabricated thereon and device 135 is shown as a representative device. Device 135 can be either a discrete device, e.g., a bipolar transistor, a field effect transistor, a resistor, a capacitor, etc. or an integrated circuit element, e.g., an amplifier, a memory circuit, a logic control circuit, an analog circuit, etc. After fabricating device 135, wafer 130 is usually diced into individual chips or dies. The chips are then packaged into unitary devices.

By now it should be appreciated that a single crystal ingot and a method and an apparatus for growing the single crystal ingot have been provided. To grow the single crystal ingot of the present invention, a single crystal seed of a material is inserted in a melt of the material. The seed is pulled up from the melt at a high pulling rate to form a thin neck to minimize the crystal dislocation in the crystal. The pulling rate is then altered to form an overhang and an elongated main body of the ingot. A multi-arm fixture is used to support, at least partially, the weight of the ingot by applying a force to the overhang of the ingot. The upward motion and the rotational motion of the multi-arm fixture are substantially synchronized with those of the single crystal ingot. Therefore, both tensile and torsional stresses on the thin neck that may be caused by a large ingot are significantly alleviated. The method and the apparatus of the present invention are suitable for use in growing large single crystal ingots.

We claim:

1. A method for growing a single crystal ingot comprising the steps of:

inserting a single crystal seed of a material into a melt of the material;

pulling the single crystal seed at a first pulling rate to grow a first neck of the single crystal ingot;

forming an overhang of the single crystal ingot below the first neck by pulling the single crystal seed at a second pulling rate and altering the second pulling rate to a third pulling rate, the third pulling rate being slower than the first pulling rate and faster than the second pulling rate;

pulling the single crystal seed at a fourth pulling rate to form an elongated body of the single crystal ingot below the overhang; and supporting the single crystal ingot by applying a plurality of forces to the overhang, a resultant force of the plurality of forces having a horizontal component substantially equal to zero and a vertical component substantially equal to or less than weight of the single crystal ingot when the plurality of forces are applied to the overhand.

2. The method as claimed in claim 1, wherein the step of supporting the single crystal ingot includes the step of grabbing the overhang with a multi-arm fixture.

3. The method as claimed in claim 2, wherein the step of grabbing the overhang includes grabbing the overhang when a length of the elongated body is greater than approximately 200 mm.

4. The method as claimed in claim 2, wherein the step of grabbing the overhang further includes synchronizing a motion of the multi-arm fixture with a motion of the single crystal ingot.

5. The method as claimed in claim 1, wherein the step of forming an overhang includes forming a tapered body of the single crystal ingot below the first neck.

6. The method as claimed in claim 5, further comprising the step of forming a second neck of the single crystal ingot between the first neck and the tapered body by pulling the single crystal seed slower than the first pulling rate and faster than the second pulling rate, the second neck having a diameter greater than a diameter of the first neck and less than a diameter of the tapered body.

7. The method as claimed in claim 5, further comprising the step of forming a shoulder of the single crystal ingot between the tapered body and the elongated body.

8. The method as claimed in claim 1, wherein the step of forming an overhang includes forming a bulb of the single crystal ingot below the first neck, the bulb having a diameter greater than a diameter of the first neck.

9. The method as claimed in claim 8, further comprising the step of forming a second neck of the single crystal ingot between the bulb and the elongated body by pulling the single crystal seed slower than the first pulling rate and faster than the second pulling rate, the second neck having a diameter greater than the diameter of the first neck and less than the diameter of the bulb.

10. A method for manufacturing a semiconductor device, comprising the steps of:

providing a semiconductor wafer by performing at least the steps of:

inserting a single crystal seed of a semiconductor material into a melt of the semiconductor material;

growing a first neck of a single crystal semiconductor ingot by pulling the single crystal seed upward;

forming an overhang of the single crystal semiconductor ingot below the first neck;

forming an elongated body of the single crystal semiconductor ingot below the overhang;

supporting the single crystal semiconductor ingot by applying a plurality of forces to the overhang, a resultant force of the plurality of forces having a horizontal component substantially equal to zero and a vertical component substantially equal to or less than weight of the single crystal semiconductor ingot, when the plurality of forces is applied to the overhand;

slicing the elongated body of the single crystal semiconductor ingot into a plurality of wafers; and selecting a wafer of the plurality of wafers as the semiconductor wafer; and fabricating the semiconductor device on the semiconductor wafer.

11. The method as claimed in claim 10, wherein the step of supporting the single crystal semiconductor ingot includes grabbing the overhang with a multi-arm fixture.

12. The method as claimed in claim 10, wherein the step of forming an overhang includes forming a tapered body of the single crystal semiconductor ingot below the first neck.

13. The method as claimed in claim 12, wherein the step of providing a semiconductor wafer further includes forming a second neck of the single crystal semiconductor ingot between the first neck and the tapered body, the second neck having a diameter greater than a diameter of the first neck and less than a diameter of the tapered body.

14. The method as claimed in claim 12, wherein the step of providing a semiconductor wafer further includes forming a shoulder of the single crystal semiconductor ingot between the tapered body and the elongated body.

15. The method as claimed in claim 10, wherein the step of forming an overhang includes forming a bulb of the single crystal semiconductor ingot below the first neck, the bulb having a diameter greater than a diameter of the first neck.

16. The method as claimed in claim 15, wherein the step of providing a semiconductor wafer further includes forming a second neck of the single crystal semiconductor ingot between the bulb and the elongated body, the second neck having a diameter greater than the diameter of the first neck and less than the diameter of the bulb.

17. The method as claimed in claim 10, further comprising the step of dicing the semiconductor wafer after the step of fabricating the semiconductor device on the semiconductor wafer.

* * * * *